United States Patent
Seshita

(10) Patent No.: US 8,686,882 B2
(45) Date of Patent: Apr. 1, 2014

(54) HIGH-FREQUENCY SEMICONDUCTOR SWITCH AND TERMINAL DEVICE

(75) Inventor: Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 13/592,288

(22) Filed: Aug. 22, 2012

(65) Prior Publication Data

US 2013/0141258 A1    Jun. 6, 2013

(30) Foreign Application Priority Data

Dec. 1, 2011    (JP) ................. 2011-263188

(51) Int. Cl.
  *H03M 9/00*    (2006.01)
(52) U.S. Cl.
  USPC ............ 341/100; 327/333; 327/427
(58) Field of Classification Search
  USPC ............ 341/100; 327/333, 427; 257/376
  See application file for complete search history.

(56) References Cited

U.S. PATENT DOCUMENTS

| | | | |
|---|---|---|---|
| 6,366,770 B1 * | 4/2002 | Seshita et al. | 455/277.1 |
| 7,564,103 B2 * | 7/2009 | Losehand et al. | 257/376 |
| 8,199,581 B2 | 6/2012 | Kim | |
| 2009/0023415 A1 | 1/2009 | Seshita | |
| 2009/0278206 A1 * | 11/2009 | Losehand et al. | 257/376 |
| 2011/0050323 A1 | 3/2011 | Seshita | |
| 2011/0095806 A1 | 4/2011 | Seshita | |

FOREIGN PATENT DOCUMENTS

| | | |
|---|---|---|
| JP | 09-251277 | 9/1997 |
| JP | 2009-027487 | 2/2009 |
| JP | 2010-103971 | 5/2010 |
| JP | 2011-054262 | 3/2011 |
| JP | 2011-055099 | 3/2011 |
| JP | 2011-091674 | 5/2011 |

* cited by examiner

*Primary Examiner* — Jean B Jeanglaude
(74) *Attorney, Agent, or Firm* — Patterson & Sheridan, LLP

(57) ABSTRACT

A high-frequency semiconductor switch includes a serial-parallel conversion circuit, a power supply circuit, and a drive circuit. In the serial-parallel conversion circuit, a parallel data signal is formed from a serial data signal input thereto. In the power supply circuit, a first positive voltage, a second positive voltage, and a negative voltage are formed from a high-potential power source supplied thereto. The drive circuit is supplied with the first positive voltage, the second positive voltage, and the negative voltage, and includes an inverter to which the parallel data signal is input and a differential type of level shifter to which the parallel data signal and the output signal of the inverter is provided. The drive circuit outputs the second positive voltage as a high level signal, and the negative voltage as a low level signal, to a switching circuit, and the switching circuit performs selective switching based thereon.

20 Claims, 12 Drawing Sheets

CLK ... CLOCK SIGNAL

CLK ... CLOCK SIGNAL

Fig. 6

During Vdd1 (unsupplied) / Vdd2 (supplied)

Present application example

| Dia | conia | conib |
|---|---|---|
| Low (Vss LEVEL) | Vn | Vp |

Comparative example

| Dia | Dib | conia | conib |
|---|---|---|---|
| Low (Vss LEVEL) | Low (Vss LEVEL) | INDEFINITE | INDEFINITE |

During Vdd1 (supplied) / Vdd2 (supplied)

Present application example

| Dia | conia | conib |
|---|---|---|
| High | Vp | Vn |
| Low | Vn | Vp |

Comparative example

| Dia | Dib | conia | conib |
|---|---|---|---|
| High | Low | Vp | Vn |
| Low | High | Vn | Vp |

HIGH-FREQUENCY SEMICONDUCTOR SWITCH AND TERMINAL DEVICE

CROSS-REFERENCE TO RELATED APPLICATION

This application is based upon and claims the benefit of priority from Japanese Patent Application No. 2011-263188, filed Dec. 1, 2011; the entire contents of which are incorporated herein by reference.

FIELD

Embodiments described herein relate to a high-frequency semiconductor switch and a terminal device.

BACKGROUND

In recent years, a high-frequency semiconductor switch for use in a receiver circuit or a transmission circuit in the communications field has progressed in design to provide high performance and high functionality. Furthermore, cost reduction, miniaturization, and high integration have been strongly required in the design of the high-frequency semiconductor switch. To meet such a requirement, instead of HEMT (High Electron Mobility Transistor) or other compound semiconductor devices conventionally used, high-frequency semiconductor switches appropriately using Silicon on Insulator (SOI) type Metal Oxide Semiconductor (MOS) transistors with smaller parasitic capacitance and smaller electric power loss than MOS transistors formed on silicon substrate, have been developed. For the SOI type MOS transistors formed on SOI substrate, multiple circuits can be easily formed on the same substrate and thus on one chip. For example, high-frequency semiconductor switch circuits, such as a serial-parallel conversion circuit, a power supply circuit, a drive circuit, a switch circuit, and so on, can all be integrated on one chip.

For the high-frequency semiconductor switch chip integrated with multiple circuits, multiple high-potential power supplies are used. In the serial-parallel conversion circuit and other digital calculation processing circuits, independent high-potential power supplies are provided. In each of the various circuits, if the high-potential power supply is in a shutoff or disconnected state, an erroneous action of the switch circuit may occur.

DESCRIPTION OF THE DRAWINGS

FIG. 6 is a diagram depicting the action of the level shift circuit when a high-potential power source is and is not supplying power.

DETAILED DESCRIPTION

Embodiments disclosed herein provide a high-frequency semiconductor switch and a terminal device capable of preventing the occurrence of erroneous actions of the switch circuit.

According to one embodiment, the high-frequency semiconductor switch is provided with a serial-parallel conversion circuit, a power supply circuit, and a drive circuit. The serial-parallel conversion circuit is connected to a first high-potential power source, and converts a serial data signal input thereto into a parallel data signal. The power supply circuit is connected to a second high-potential power source, and generates a first positive voltage, a second positive voltage, and a negative voltage on the basis of the second high-potential power source. The drive circuit is supplied with the first positive voltage, the second positive voltage, and the negative voltage, and includes an inverter to which the parallel data signal is input and a differential type of level shifter to which the parallel data signal and the output signal of the inverter is provided. The drive circuit outputs the second positive voltage as a high level signal and the negative voltage as a low level signal to the switch circuit.

According to another embodiment, the terminal device is provided with a high-frequency semiconductor switch. The high-frequency semiconductor switch has a serial-parallel conversion circuit, a power supply circuit, a drive circuit, and a switch circuit. The serial-parallel conversion circuit is connected to a first high-potential power source, and converts a serial data signal input thereto into a parallel data signal. The power supply circuit is connected to a second high-potential power source, and generates a first positive voltage, a second positive voltage, and a negative voltage on the basis of the second high-potential power source. The drive circuit is supplied with the first positive voltage, the second positive voltage, and the negative voltage, and includes an inverter to which the parallel data signal is input, and a differential type of level shifter to which the parallel data signal and the output signal of the inverter is provided. The drive circuit outputs the second positive voltage as a high level signal, and the negative voltage as a low level signal to the switch circuit. The switch circuit receives as input the high level and low level signals from the drive circuit and, on the basis of the signals output from the drive circuit, makes a connection between an RF common signal terminal and one of multiple RF signal terminals.

Embodiment 1

Figure 1:
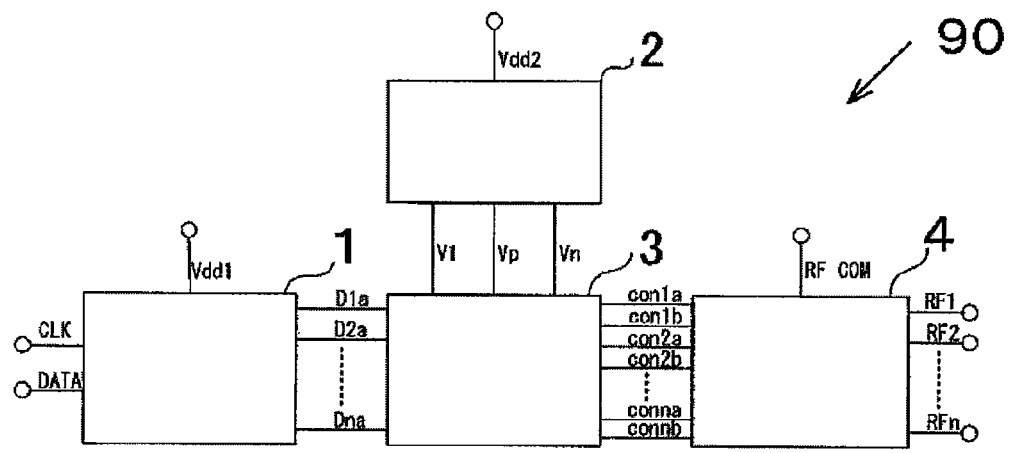
FIG. 1 is a block diagram showing the configuration of a high-frequency semiconductor switch according to a first embodiment.
Figure 2:
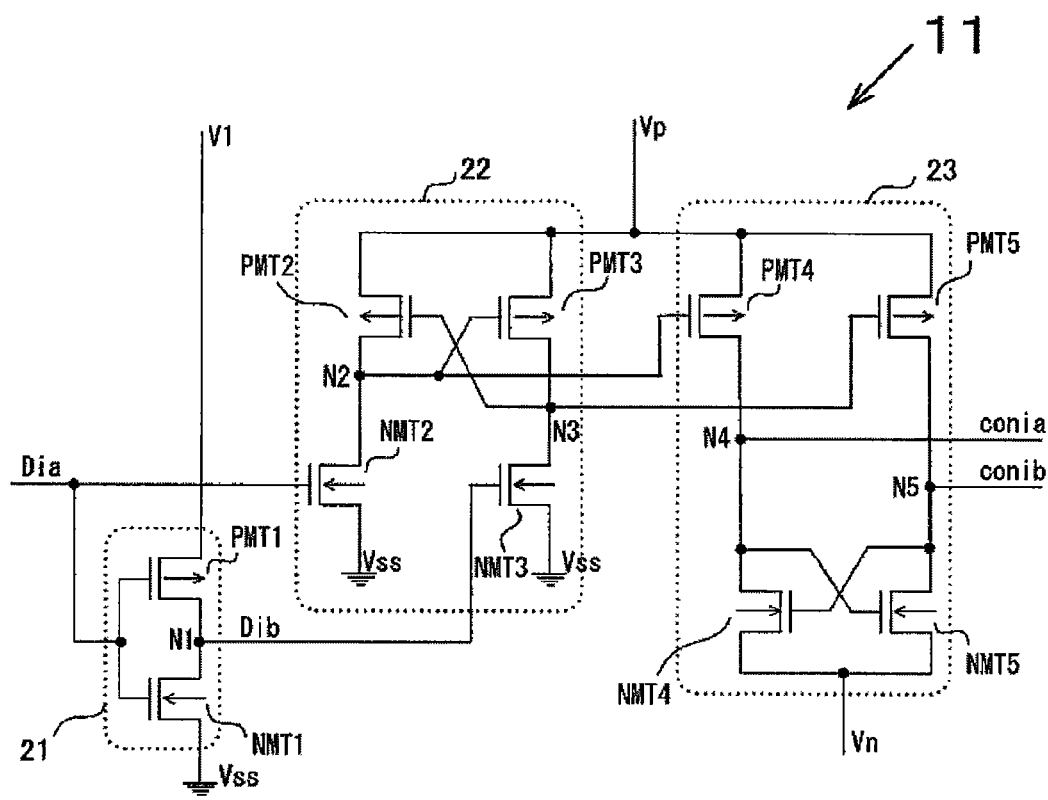
FIG. 2 is a circuit diagram showing a level shift circuit provided in a drive circuit provided in the first embodiment.
Figure 3:
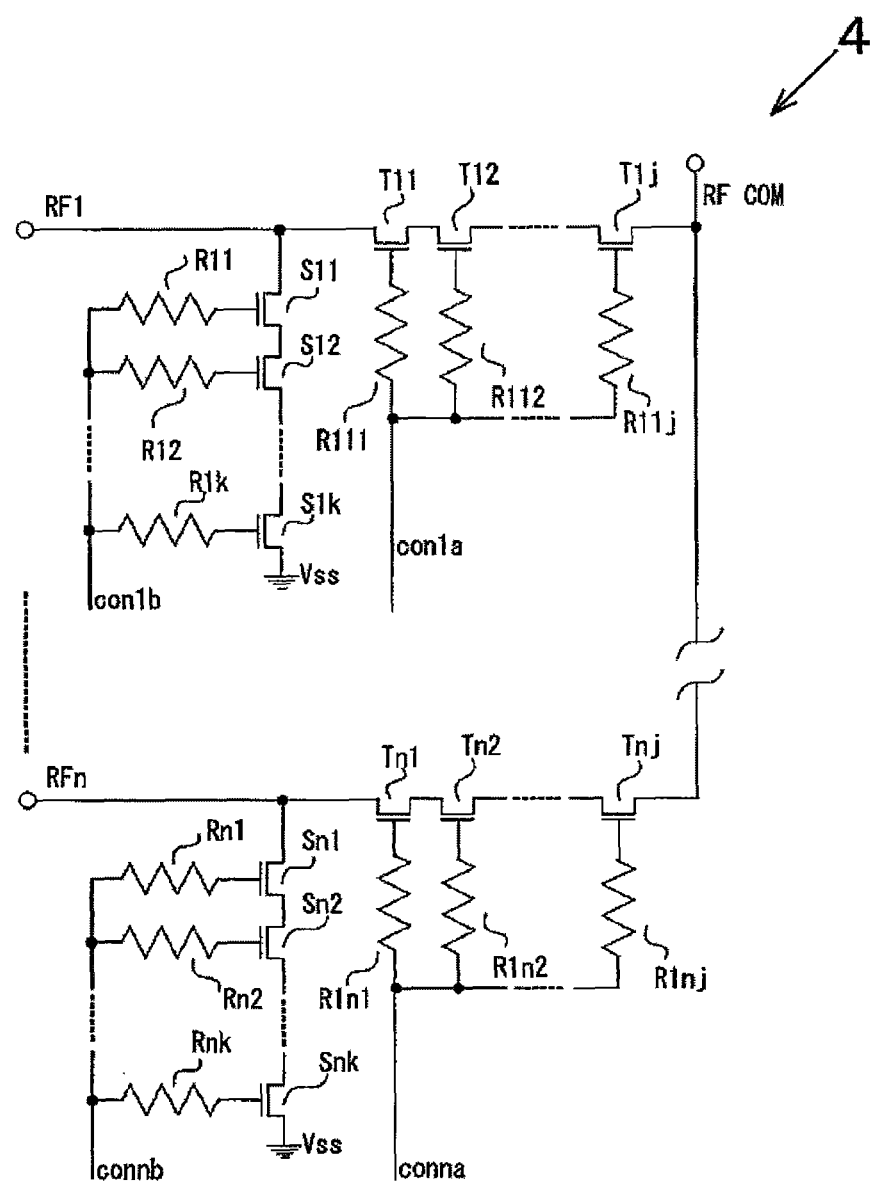
FIG. 3 is a circuit diagram showing a switch circuit provided in the first embodiment.
Figure 4:
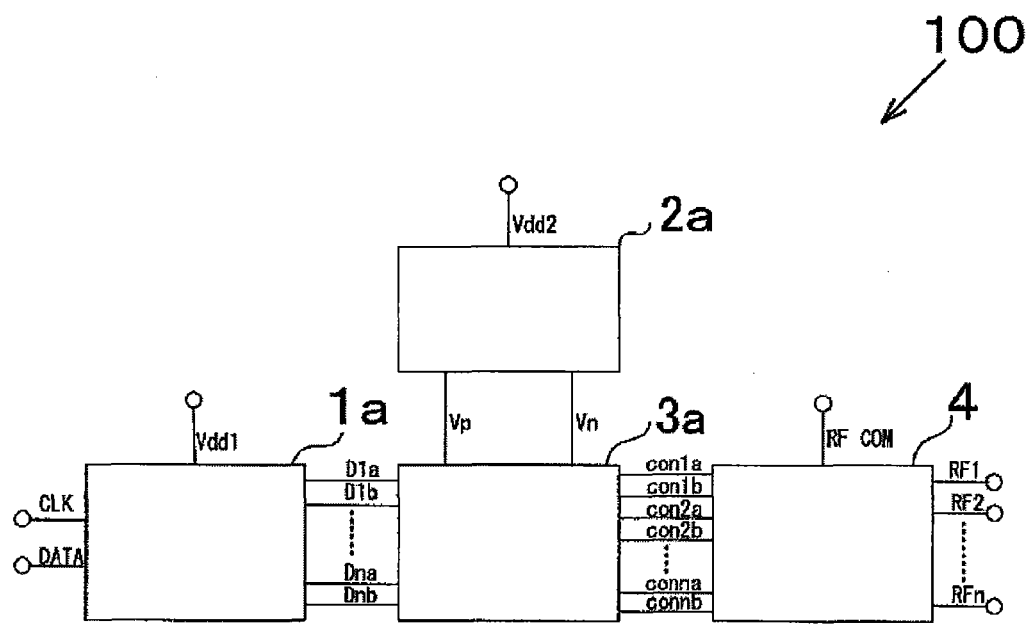
FIG. 4 is a block diagram showing the configuration of a high-frequency semiconductor switch of a comparative example.
Figure 5:
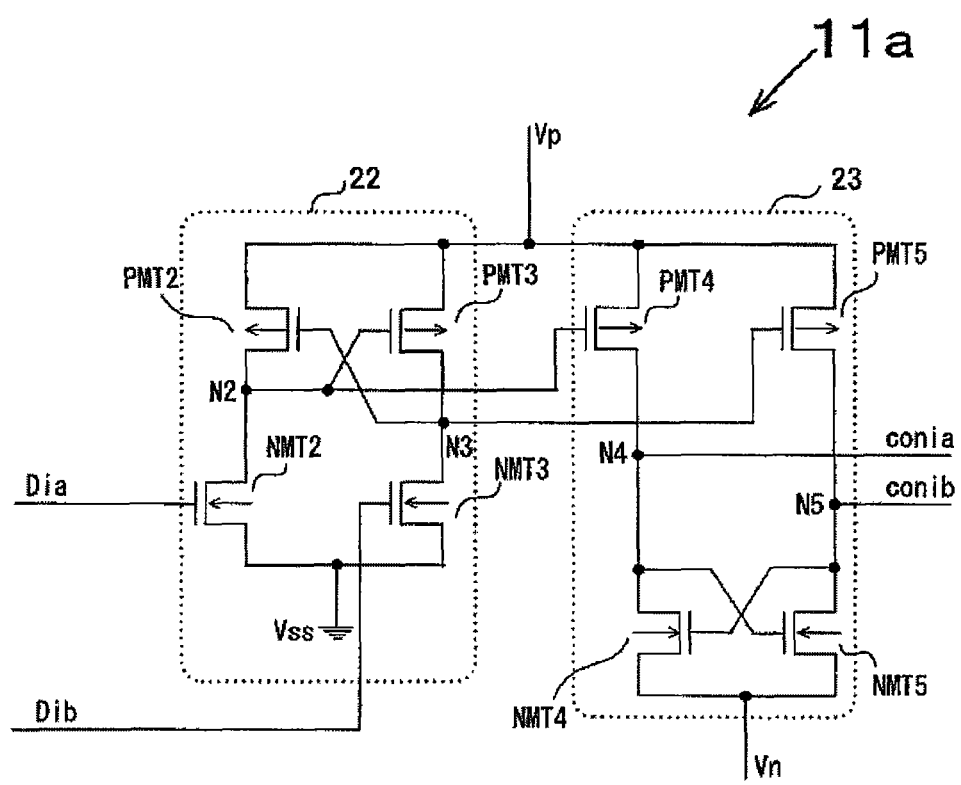
FIG. 5 is a circuit diagram showing a level shift circuit provided in a drive circuit of the comparative example.
Figure 13:
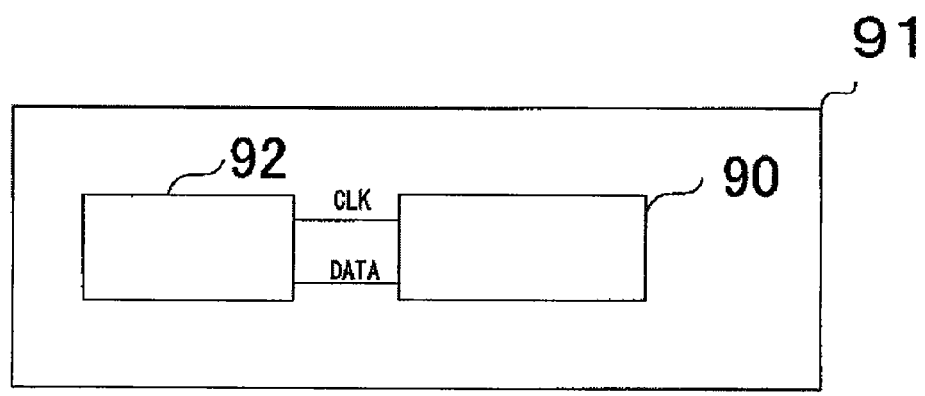
FIG. 13 is a block diagram showing a terminal device according to an embodiment.

First, for the high-frequency semiconductor switch and the terminal device according to Embodiment 1, an explanation will be given with reference to diagrams. FIG. 13 is a block diagram showing the terminal device. FIG. 1 is a block diagram showing the configuration of the high-frequency semiconductor switch. FIG. 2 is a circuit diagram showing a level shift circuit provided in a drive circuit of the high-frequency semiconductor switch. FIG. 3 is a circuit diagram showing a switch circuit of the high-frequency semiconductor switch. FIG. 4 is a block diagram showing the configuration of the high-frequency semiconductor switch of the comparative example. FIG. 5 is a circuit diagram showing a level shift circuit provided in a drive circuit of the comparative example. In the comparative example, the level shift circuit provided in the drive circuit is configured so that the connected state of the switch circuit may be indefinite.

FIG. 13 shows a terminal device 91 including a high-frequency semiconductor switch 90 and a data processing section 92. The terminal device 91 is used as a portable telephone terminal, a portable type information terminal, or the like. The data processing section 92 outputs a clock signal CLK and a serial data signal DATA to the high-frequency semiconductor switch 90. The high-frequency semiconductor switch 90 is typically used in a transmission circuit and a receiver circuit of a communication device. As illustrated, it is used in a transmission circuit and a receiver circuit of a portable telephone terminal.

As shown in FIG. 1, a high-frequency semiconductor switch 90 includes a serial-parallel conversion circuit 1, a power supply circuit 2, a drive circuit 3, and a switch circuit 4. The serial-parallel conversion circuit 1, the power supply circuit 2, the drive circuit 3, and the switch circuit 4 are formed on a same substrate (and in one embodiment, integrated as a single chip), and made from Silicon on Insulator (SOI) type Metal Oxide Semiconductor (MOS) transistors formed on the SOI substrate.

The serial-parallel conversion circuit 1 is made up of a logic circuit or a sequential circuit (flip-flop or the like). To the serial-parallel conversion circuit 1, a high-potential power source Vdd1 is supplied, and a clock signal CLK and a serial signal DATA synchronized with the clock signal CLK are input. The serial-parallel conversion circuit 1 forms multiple parallel data signals D1a, D2a, . . . , Dna as a result of the serial-parallel conversion. The multiple parallel data signals D1a, D2a, . . . , Dna are input to the drive circuit 3. For the multiple parallel data signals D1a, D2a, . . . , Dna, a high level signal has a signal level of Vdd1, and the low level signal has a signal level of Vss (e.g., ground). The serial-parallel conversion circuit is also called a decoder circuit or a shift register.

For the power supply circuit 2, the high-potential power source Vdd2 is supplied. On the basis of the high-potential power source Vdd2, a positive voltage V1 (the first positive voltage), a positive voltage Vp (the second positive voltage), and a negative voltage Vn are formed. The positive voltage V1, the positive voltage Vp, and the negative voltage Vn are input to the drive circuit 3.

Here, the high-potential power source Vdd1 and the high-potential power source Vdd2 are supplied to the high-frequency semiconductor switch 90 from the outside by a separate system. The relationship between the first high-potential power source Vdd1 voltage, the second high-potential power source Vdd2 voltage, the positive voltage V1, and the positive voltage Vp is set according to Equation (1) below.

$$Vdd1 = V1 < Vdd2 < V_p \qquad \text{Eqn. (1)}$$

In one example, the high-potential power source Vdd1 and the positive voltage V1 are set at 1.8 V, the high-potential power source Vdd2 is set at 2.5 V, the positive voltage Vp is set at 3.5 V, and the negative voltage Vn is set at −1.5 V.

The positive voltage V1 may be formed from, for example, a voltage decreasing type of regulator (not shown in the diagram). The positive voltage Vp and the negative voltage Vn may be formed from a charge pump circuit (not shown in the diagram).

To the drive circuit 3, the positive voltage V1, the positive voltage Vp, and the negative voltage Vn are supplied, and the multiple parallel data signals (D1a, D2a, . . . , Dna) are input. In the drive circuit 3, multiple level shift circuits 11 causing the respective inputting of the multiple parallel data signals D1a, D2a, . . . , Dna and having the same circuit constitution are provided (in the example given herein, n units). The drive circuit 3 forms multiple (in the example given herein, 2n units) differential outputs con1a, con1b, con2a, con2b, . . . , conna, connb for outputting to the switch circuit 4. The differential output con1a and the differential output con1b are signals of the same phase, and the differential output con1b is the complementary signal to the differential output con1a. The differential output con2a and the differential output con2b are signals of the same phase, and the differential output con2b is the complementary signal to the differential output con2a. In general, the differential output conna and the differential output connb are signals of the same phase, and the differential output connb is the complementary signal to the differential output conna.

In regard to the internal constitution of the level shift circuits 11, an explanation will be given with reference to FIG. 2. In FIG. 2, the level shift circuit 11 with the $i^{th}$ parallel data signal Dia as the input will be explained as a representative example.

As shown in FIG. 2, in the level shift circuit 11, an inverter 21, a level shifter 22 and a level shifter 23 are provided. For the level shift circuit 11, the parallel data signal Dia is input, and the differential outputs conia, conib being of the same phase and having mutually complementary magnitudes are output. For example, when the differential output conia is at a high level (the positive voltage Vp), the differential output conib is at a low level (the negative voltage Vn). When the differential output conia is at the low level (the negative voltage Vn), the differential output conib is at the high level (the positive voltage Vp).

The inverter 21 is provided with a Pch MOS transistor PMT1 and an Nch MOS transistor NMT1. For the inverter 21, the parallel data signal Dia is input, and the parallel data signal Dib as the inverse signal is output from the output side node N1.

For the Pch MOS transistor PMT1, the positive voltage V1 is supplied to its source, the parallel data signal Dia is input to its gate, and the drain is connected to the node N1. For the Nch MOS transistor NMT1, the drain is connected to the node N1, the parallel data signal Dia is input to its gate, and its source is connected to the low-potential power source Vss (e.g., ground).

The level shifter 22 (the first level shifter) is provided with Pch MOS transistor PMT2, Pch MOS transistor PMT3, Nch MOS transistor NMT2, and Nch MOS transistor NMT3. The level shifter 22 is a differential type of level shifter, into which the parallel data signal Dia and the parallel data signal Dib are input, and the differential output signals are output from the nodes N2 and N3. When the signal output from the node N2 is at the high level (the positive voltage Vp), the signal output from the node N3 is at the low level (the Vss level). When the signal output from the node N2 is at the low level (the Vss level), the signal output from the node N3 is at the high level (the positive voltage Vp).

For the Pch MOS transistor PMT2, the positive voltage Vp is supplied to its source, its gate is connected to the node N3, and its drain is connected to the node N2. For the Pch MOS transistor PMT3, the positive voltage Vp is supplied to its source, its gate is connected to the node N2, and its drain is connected to the node N3. The Pch MOS transistor PMT2 and the Pch MOS transistor PMT3 constitute a close-coupled circuit.

For the Nch MOS transistor NMT2, its drain is connected to the node N2, the parallel data signal Dia is input to its gate, and its source is connected to the low-potential power source Vss (e.g., ground). For the Nch MOS transistor NMT3, its drain is connected to the node N3, the parallel data signal Dib is input to its gate, and its source is connected to the low-potential power source Vss (e.g., ground).

The level shifter 23 (the second level shifter) is provided with Pch MOS transistor PMT4, Pch MOS transistor PMT5, Nch MOS transistor NMT4, and Nch MOS transistor NMT5. The level shifter 23 is a differential type of level shifter, into which the signal output from the level shifter 22 is input, and differential output signals are output from the nodes N4 and N5. When the signal output from the node N4 is at a high level (the positive voltage Vp), the signal output from the node N5 is at a low level (the negative Vn). When the signal output from the node N4 is at the low level (the negative Vn), the signal output from the node N5 is at the high level (the positive voltage Vp).

For the Pch MOS transistor PMT4, the positive voltage Vp is supplied to its source, the signal output from the node N2 is input to its gate, and its drain is connected to the node N4. For the Pch MOS transistor PMT5, the positive voltage Vp is supplied to its source, the signal output from the node N3 is input to its gate, and its drain is connected to the node N5.

For the Nch MOS transistor NMT4, the drain is connected to its node N4, the gate is connected to the N5, and the negative voltage Vn is supplied to its source. For the Nch MOS transistor NMT5, its drain is connected to the node N5, its gate is connected to the node N4, and its negative voltage Vn is supplied to its source. The Nch MOS transistor NMT4 and the Nch MOS transistor NMT5 constitute a close-coupled circuit.

The switch circuit 4 is a Single-Pole N-Throw (SPNT) high-frequency switch circuit. For the switch circuit 4, multiple (in the example given herein, 2n units) differential outputs con1a, con1b, con2a, con2b, . . . , conna, connb are input, and on the basis of the differential outputs for the common high-frequency signal RF COM input via the antenna, any one of the high-frequency signals RF1, RF2, . . . , RFn is selected and output. The selected and output high-frequency signal is input into the RF section (for example, low noise amplifier (LNA)) of the receiver circuit.

As shown in FIG. 3, the switch circuit 4 is provided with a resistor R11, a resistor R12, a resistor R1k, a resistor Rn1, a resistor Rn2, a resistor Rnk, a resistor R111, a resistor R112, a resistor R11j, a resistor R1n1, a resistor R1n2, a resistor R1nj, a shunt transistor S11, a shunt transistor S12, a shunt transistor S1k, a shunt transistor Sn1, a shunt transistor Sn2, a shunt transistor Snk, a through transistor T11, a through transistor T12, a through transistor T1j, a through transistor Tn1, a through transistor Tn2, and a through transistor Tnj.

Between the high-frequency signal RF1 side and the low-potential power source Vss (e.g., ground), the cascade connected k units of the shunt transistors S11 to S1k are provided. Between the high-frequency signal RF1 side and the common high-frequency signal RF COM side, the cascade connected j units of the through transistors T11 to T1j are provided. Between the high-frequency signal RFn side and the low-potential power source Vss (e.g., ground), the cascade connected k units of the shunt transistors Sn1 to Snk are provided. Between the high-frequency signal RFn side and the common high-frequency signal RF COM side, the cascade connected j units of the through transistors Tn1 to Tnj are provided.

Between the differential output con1b side and the gate of the shunt transistor S11, the resistor R11 is provided. Between the differential output con1b side and the gate of the shunt transistor S12, the resistor R12 is provided. Between the differential output con1b side and the gate of the shunt transistor S1k, the resistor R1k is provided. Between the differential output con1a side and the gate of the through transistor T11, the resistor R111 is provided. Between the differential output con1a side and the gate of the through transistor T12, the resistor R112 is provided. Between the differential output con1a side and the gate of the through transistor T1j, the resistor R11j is provided.

Between the differential output connb side and the gate of the shunt transistor Sn1, the resistor Rn1 is provided. Between the differential output connb side and the gate of the shunt transistor Sn2, the resistor Rn2 is provided. Between the differential output connb side and the gate of the shunt transistor Snk, the resistor Rnk is provided. Between the differential output conna side and the gate of the through transistor Tn1, the resistor R1n1 is provided. Between the differential output conna side and the gate of the through transistor Tn2, the resistor R1n2 is provided. Between the differential output conna side and the gate of the through transistor Tnj, the resistor R1nj is provided.

Here, the threshold value voltage (Vth) of the transistor constituting the switch circuit is set at, for example, 0 (zero) V. When the differential output con1b is at the low level (the negative voltage Vn) and the differential output con1a is set at the high level (the positive voltage Vp), the cascade connected k units of the shunt transistors S11 to S1k are off, and the cascade connected j units of the through transistors T11 to T1j are on. As a result, there is a connection between the high-frequency signal RF1 side and the common high-frequency signal RF COM side, and the common high-frequency signal RF COM is output as the high-frequency signal RF1. When the differential output con1b is at the high level (the positive voltage Vp) and the differential output con1a is set at the low level (the negative voltage Vn), there is no connection between the high-frequency signal RF1 side and the common high-frequency signal RF COM side.

When the differential output connb is at the low level (the negative voltage Vn) and the differential output conna is set at the high level (the positive voltage Vp), the cascade connected k units of the shunt transistors Sn1 to Snk are off, and the cascade connected j units of the through transistors Tn1 to Tnj are on. As a result, there is a connection between the high-frequency signal RFn side and the common high-frequency signal RF COM side, and the common high-frequency signal RF COM is output as the high-frequency signal RFn. When the differential output connb is at the high level (the positive voltage Vp) and the differential output conna is set at the low level (the negative voltage Vn), there is no connection between the high-frequency signal RFn side and the common high-frequency signal RF COM side.

FIG. 4 shows a high-frequency semiconductor switch 100 of the comparative example, which includes a serial-parallel conversion circuit 1a, a power supply circuit 2a, a drive circuit 3a, and a switch circuit 4.

To the serial-parallel conversion circuit 1a, the high-potential power source Vdd1 is supplied, and the clock signal CLK and the serial signal DATA synchronized with the clock signal CLK are input. The serial-parallel conversion circuit 1a forms multiple parallel data signals D1a, D1b, Dna, Dnb (twice the amount relative to the serial-parallel conversion circuit 1)

subjected to the serial-parallel conversion. The parallel data signal D1a and the parallel data signal D1b, . . . , the parallel data signal Dna and the parallel data signal Dnb are respectively differential outputs. The multiple parallel data signals D1a, D1b, . . . , Dna, Dnb formed are input to the drive circuit 3a.

For a power supply circuit 2a, the high-potential power source Vdd2 is supplied, and on the basis of the high-potential power source Vdd2, the positive voltage Vp (the second positive voltage) and the negative voltage Vn are formed. The positive voltage Vp and the negative voltage Vn formed are input to the drive circuit 3a.

To the drive circuit 3a, the positive voltage Vp and the negative voltage Vn are supplied, and the multiple parallel data signals (D1a, D1b, . . . , Dna, Dnb) are input. In the drive circuit 3a, the level shift circuits 11a having the same circuit configuration, to which the parallel data signal D1a and the parallel data signal D1b as its reverse signal forming the differential output pair, . . . , the parallel data signal Dna and the parallel data Dnb as its reverse signal are input, are provided in multiples (here, n units). The drive circuit 3a forms multiple (here, 2n units) differential signals con1a, con1b, con2a, con2b, . . . , conna, connb that are output to the switch circuit 4.

In regard to the internal configuration of the level shift circuit 11a, an explanation will be given with reference to FIG. 5. Here, the level shift circuit 11a to which the i$^{th}$ parallel data signals Dia and Dib are input will be explained as a typical example.

As shown in FIG. 5, in the level shift circuit 11a, the level shifter 22 and the level shifter 23 are provided. The parallel data signals Dia and Dib are input to the level shift circuit 11a, and the differential outputs conia and conib being of the same phase and having mutually reverse values are output from the level shift circuit 11a.

Next, in regard to the actions of the level shift circuit, an explanation will be given in reference to FIG. 6. FIG. 6 is a diagram that explains the action of the level shift circuit when a high-potential power source is and is not supplying power.

As shown in FIG. 6, with the high-frequency semiconductor switch 90 of the present embodiment, when the high-potential power source Vdd1 is shut off (not supplied) and the high-potential power source Vdd2 is supplied, the parallel data signals D1a, D2a, . . . , Dna output from the serial-parallel conversion circuit 1 are all set at the low level (the Vss level). The differential outputs con1a, con2a, . . . , conna output from the drive circuit 3 are all set at the low level (the negative voltage Vn), and the differential outputs con1b, con2b, connb are all set at the high level (the positive voltage Vp). The connected state of the switch circuit 4 will therefore not be in an indefinite state. In the switch circuit 4, the through transistor is off and the shunt transistor is on, and so there is a reliable shutoff between the common high-frequency signal RF COM side and the high-frequency signals RF1, RF2, . . . , RFn side.

On the other hand, with the high-frequency semiconductor switch 100 of the comparative example, when the high-potential power source Vdd1 is shut off (not supplied) and the high-potential power source Vdd2 is supplied, the parallel data signals D1a, D1b, . . . , Dna, Dnb output from the serial-parallel conversion circuit 1a are all set at the low level (the Vss level). The differential outputs con1a, con1b, con2a, . . . , conna, connb output from the drive circuit 3a are all in the indefinite state. In the switch circuit 4, it is impossible for the through transistor to be off and the shunt transistor to be on. As a result, a reliable shutoff between the common high-frequency signal RF COM side and the high-frequency signals RF1, RF2, . . . , RFn side is not possible.

When the high-potential power source Vdd1 is supplied and the high-potential power source Vdd2 is supplied, the high-frequency semiconductor switch 90 of the present embodiment and the high-frequency semiconductor switch 100 of the comparative example will act normally in the manner shown in FIG. 6. Specifically, on the basis of the differential outputs conia, conib, only the common high-frequency signal RF COM side and the high-frequency signal RFi side are selectively connected.

As described above, the high-frequency semiconductor switch of the present embodiment is provided with the terminal device, the serial-parallel conversion circuit 1, the power supply circuit 2, the drive circuit 3, and the switch circuit 4. For the serial-parallel conversion circuit 1, the high-potential power source Vdd1 is supplied, and the serial data signal DATA is subjected to the serial-parallel conversion. For the power supply circuit 2, the high-potential power source Vdd2 is supplied, and the positive voltage V1, the positive voltage Vp, and the negative voltage Vn are formed. For the drive circuit 3, the parallel data signal Dia subjected to the serial-parallel conversion is input, the positive voltage V1, the positive voltage Vp, and the negative voltage Vn are supplied, and the level shift circuits 11 for the formation of the differential output conia or the differential output conib with the positive voltage Vp at the high level and Vn at the low level are provided in plural.

Therefore, with the high-frequency semiconductor switch 90, when the high-potential power source Vdd1 is shut off (not supplied) and the high-potential power source Vdd2 is supplied, the connected state of the switch circuit 4 can be such that it is not indefinite, and the occurrence of erroneous actions can be prevented.

Figure 7:
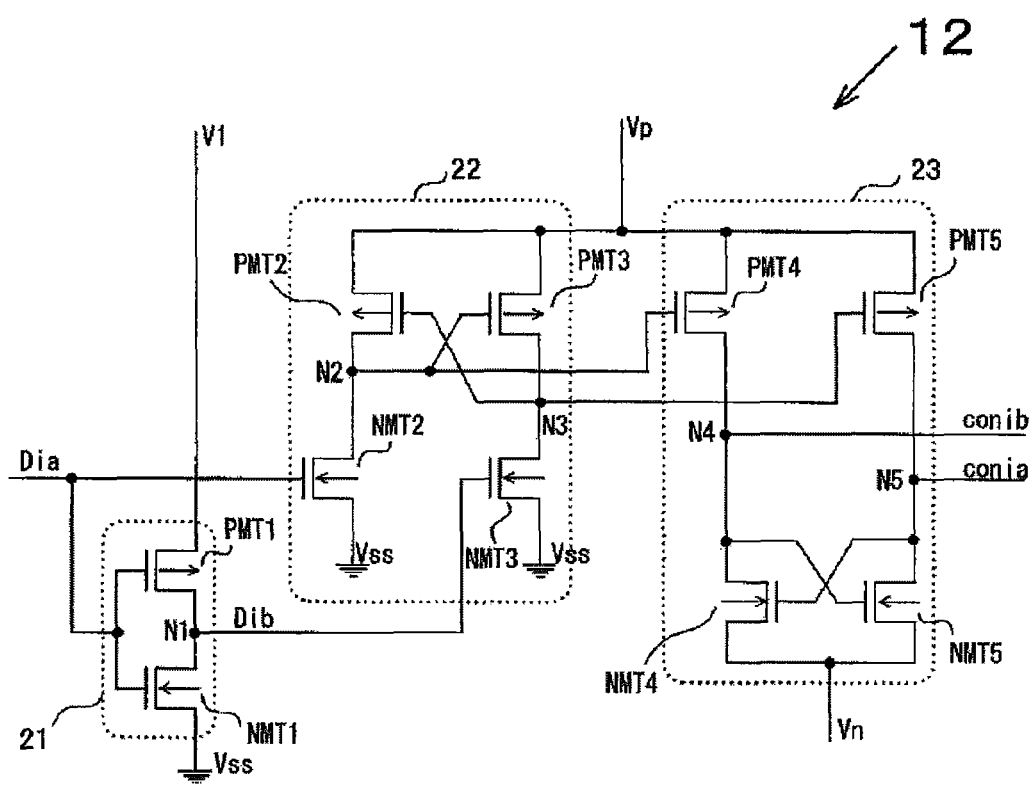
FIG. 7 is a circuit diagram showing a level shift circuit of the first modified example.

It is also acceptable to change the level shift circuits 11 of the present embodiment to the level shift circuits 12 of the first modified example shown in FIG. 7. Specifically, as shown in FIG. 7, it is also acceptable to set the signal output from the node N4 of the level shifter 23 to the differential output conib, and the signal output from the node N5 to the differential output conia (the reverse of the level shift circuits 11). By setting in this manner, when the high-potential power source Vdd1 is shut off (not supplied) and the high-potential power source Vdd2 is supplied, it is possible to have the selective connection between the common high-frequency signal RF COM side (the RF COM port) of the switch circuit 4 and the high-frequency signal RFi side (the RFi port).

Figure 8:
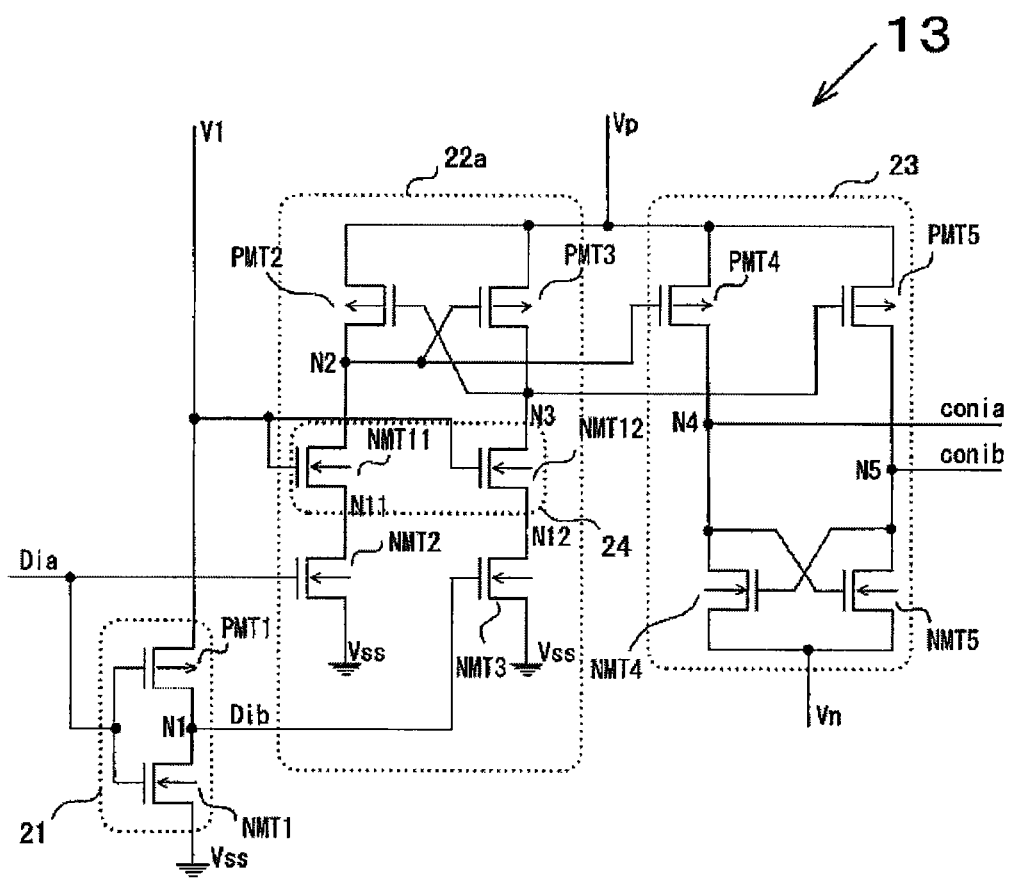
FIG. 8 is a circuit diagram showing a level shift circuit of the second modified example.

Furthermore, the level shift circuit 11 of the present embodiment can also be changed to the level shift circuit 13 of the second modified example shown in FIG. 8. Specifically, as shown in FIG. 8, the level shift circuit 13 is constituted by the inverter 21, a level shifter 22a, and the level shifter 23. For the level shifter 22a, the source follower circuit 24 constituted by the Nch MOS transistor NMT11 and the Nch MOS transistor NMT12 is added to the level shifter 22 of the present embodiment. For the Nch MOS transistor NMT11, its drain is connected to the node N2, the positive voltage V1 is supplied to the gate, and its source is connected to the node N11 and the drain of the Nch MOS transistor NMT2. For the Nch MOS transistor NMT12, its drain is connected to the node N3, the positive voltage V1 is supplied to its gate, and its source is connected to the node N12 and the drain of the Nch MOS transistor NMT3.

Embodiment 2

Figure 9:
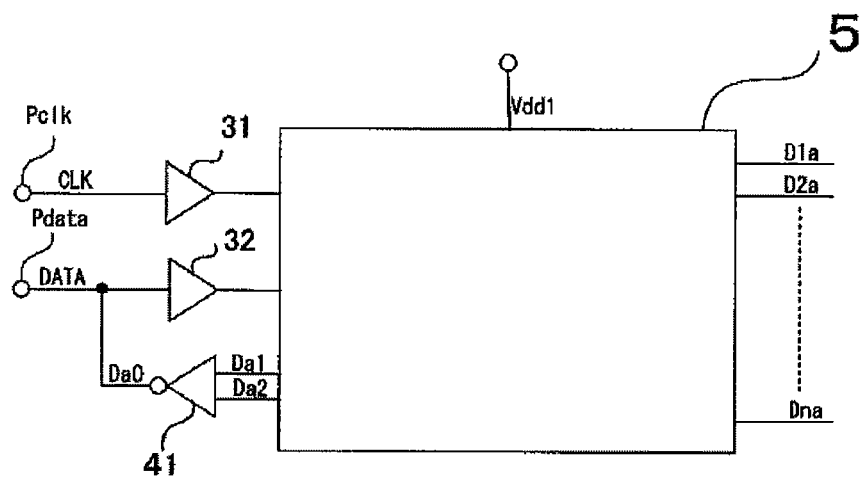
FIG. 9 is a circuit diagram showing a serial-parallel conversion circuit according to a second embodiment.
Figure 10:
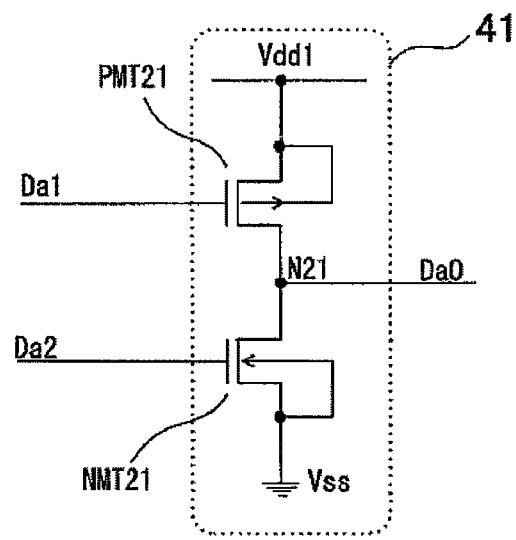
FIG. 10 is a circuit diagram showing an output buffer according to the second embodiment.

Next, in regard to the high-frequency semiconductor and the terminal device according to Embodiment 2, an explanation will be given with reference to diagrams. FIG. 9 is a circuit diagram showing the serial-parallel conversion circuit. FIG. 10 is a circuit diagram showing the output buffer. In the present embodiment, the level of improvement in ESD (Electrostatic Discharge) resistance and the achievement in high speed are made compatible by separately using a transistor with a back gate that is floating and a transistor with a back gate that is source-grounded.

The high-frequency semiconductor switch of the present embodiment has the same circuit constitution as the high-frequency semiconductor switch 90 of Embodiment 1 except the serial-parallel conversion circuit 5 portion, is formed on the same substrate (e.g., integrated on one chip), and is constituted from the SOI type MOS transistor. Therefore, only the different portions will be explained.

As shown in FIG. 9, the input buffer 31 is provided between the serial-parallel conversion circuit 5 and the terminal Pclk. The input buffer 32 and the output buffer 41 are provided between the serial-parallel conversion circuit 5 and the terminal Pdata.

The terminal Pclk outputs the input clock signal CLK into the input buffer 31. The input buffer 31 drives the clock signal for outputting to the serial-parallel conversion circuit 5. The terminal Pdata outputs the input serial data signal DATA to the input buffer 32. The input buffer 32 drives the serial data signal DATA for outputting to the serial-parallel conversion circuit 5. The output buffer 41 is the inverter having the Hi−Z (high impedance) output mode. For the output buffer 41, the data signal Da1 and the data signal Da2 output from the serial-parallel conversion circuit 5 are input, and the data signal Da0 subjected to signal processing is output to the terminal Pdata.

In the SOI type MOS transistors constituting the input buffer 31, the input buffer 32, the output buffer 41, and the serial-parallel conversion circuit 5, the SOI type MOS transistors with the complete-depletion-type structure capable of high speed actions are used.

For the terminal Pclk and the terminal Pdata, the ESD protective elements not shown in the diagram are provided. For the terminal Pdata, since the data signal Da0 is output from the output buffer 41, the ESD immunity has a tendency to decrease in comparison to the terminal Pdata.

The serial-parallel conversion circuit 5 has the high-potential power source Vdd1 supplied thereto, and is synchronized to the clock signal CLK driven by the input buffer 31 and the Nch clock signal CLK, and input with the serial signal DATA driven by the input buffer 32. The serial-parallel conversion circuit 5 forms the multiple parallel data signals D1a, D2a, ..., Dna subjected to the serial-parallel conversion. The multiple parallel data signals D1a, D2a, ..., Dna formed are output to the drive circuit 3. The serial-parallel conversion circuit 5 forms the data signal Da1 and the data signal Da2, separate from the multiple parallel data signals D1a, D2a, ..., Dna.

As shown in FIG. 10, the output buffer 41 is configured with the Pch MOS transistor PMT 21 and the Nch MOS transistor NMT 21, and outputs the output signal from the node N 21.

For the Pch MOS transistor PMT 21, its source is connected to the high-potential power source Vdd1, the data signal Da1 is input to its gate, its drain is connected to the node N 21, and its back gate is connected to its source. The Pch MOS transistor PMT 21 is the SOI type MOS transistor that has the back gate source-grounded.

For the Nch MOS transistor NMT 21, its drain is connected to the node N 21, the signal Da2 is input to its gate, its source is connected to the low-potential power source Vss (e.g., ground), and its back gate is connected to its source. The Nch MOS transistor NMT 21 is the SOI type MOS transistor that has the back gate source-grounded.

The output buffer 41 does not carry out the inverter action when the data signal Da1 is at the high level and the data signal Da2 is at the low level. The node N 21 on the output side is in the Hi-Z (high impedance) state, and the signal is not output from the terminal Pdata to the outside.

The output buffer 41 carries out the inverter action when the data signal Da1 is at the low level and the data signal Da2 is at the low level. From the node N 21 on the output side to the terminal Pdata, the data signal Da0 of the high level Vdd1 is output. The output buffer 41 carries out the inverter action when the data signal Da1 is at the high level and the data signal Da2 is at the high level. From the node N 21 on the output side to the terminal Pdata, the data signal Da0 of the low level Vss is output.

Here, although not shown in the diagram, the input buffer 31, the input buffer 32, and the Pch MOS transistor and the Nch MOS transistor constituting the serial-parallel conversion circuit 5 are each of the SOI type MOS transistors with the back gate floating.

Figure 11A:
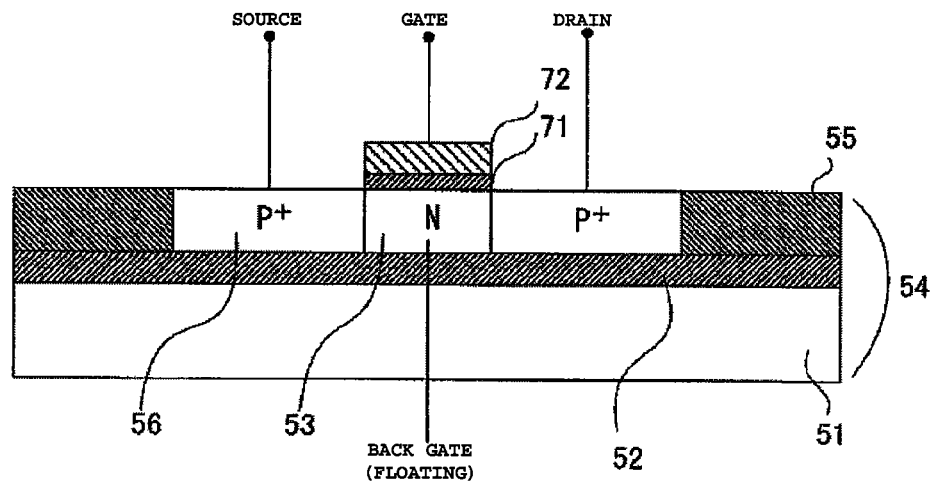
FIGS. 11A and 11B are schematic cross-sectional diagrams showing a transistor with a floating back gate as provided in the second embodiment.
Figure 11B:
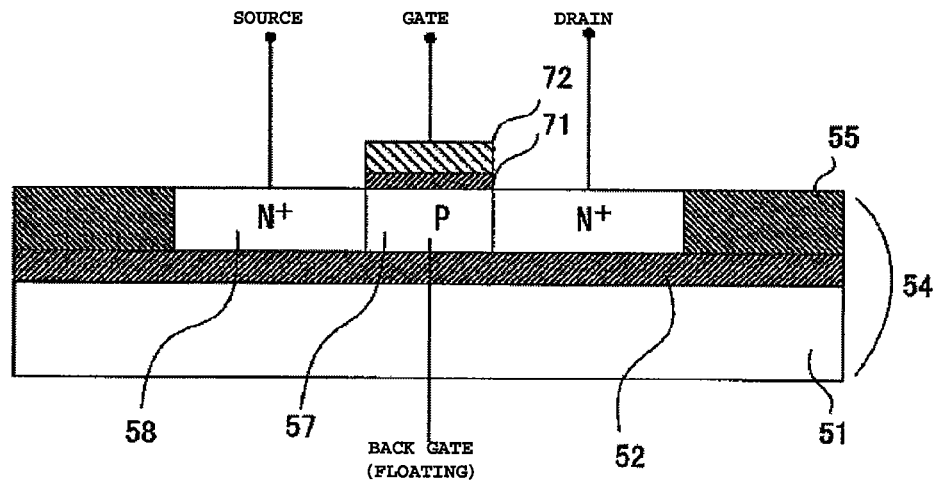
Figure 12A:
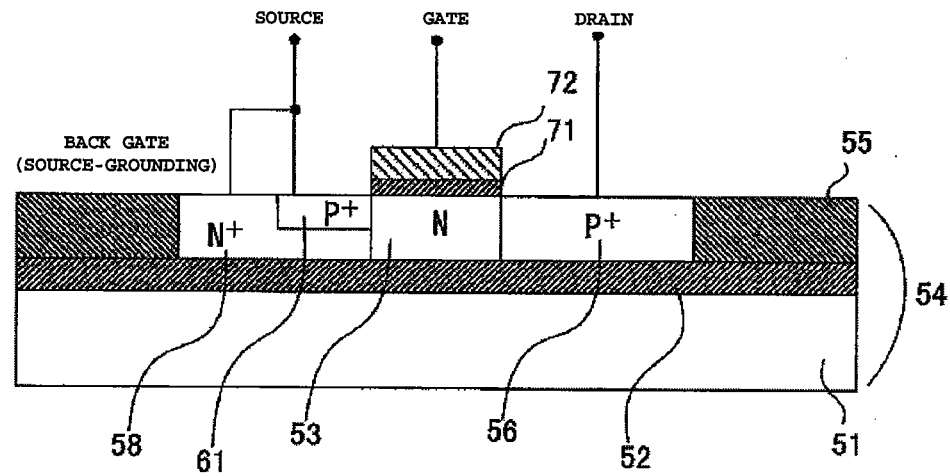
FIGS. 12A and 12B are schematic cross-sectional diagrams showing a transistor with a source-grounded back gate as provided in the second embodiment.
Figure 12B:
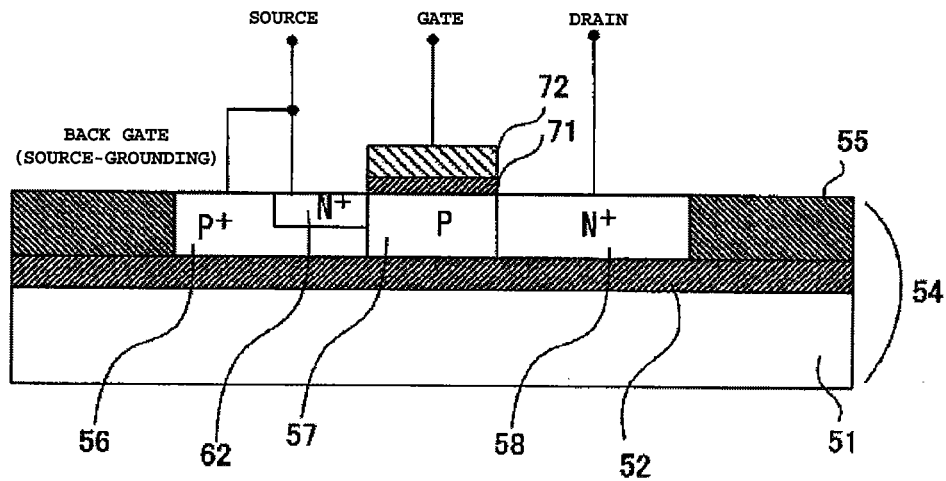

Next, in regard to the structures and the characteristics of the SOI type MOS transistor with the back gate being source-grounded and the SOI type MOS transistor with the back gate floating, an explanation will be given with reference to FIGS. 11A and 11B and FIGS. 12A and 12B. FIGS. 11A and 11B are schematic cross-sectional diagrams showing the transistor with the back gate floating. FIGS. 12A and 12B are schematic cross-sectional diagrams showing the transistor with the back gate being source-grounded. In order to simplify the expression, from now on, the SOI type MOS transistor with the back gate being source-grounded will be called an S type FET, and the SOI type MOS transistor with the back gate floating will be called an F type FET.

As shown in FIG. 11A, for the F type FET (Pch), the Pch MOS transistor is formed on the SOI substrate 54 constituted from the first substrate 51, the box layer (the buried in oxide film) 52, and the second substrate (not shown in the diagram). In the second substrate (not shown in the diagram), the N layer 53, the STI (the shallow trench isolation) 55, and the P$^+$ layer 56 are provided. The N layer 53 and the P$^+$ layer 56 are separated with the STI (the shallow trench isolation) 55 in the surrounding. The N layer 53 as the back gate is provided with the P$^+$ layer 56 as the source and the P$^+$ 56 as the drain on both sides thereof. On top of the N layer 53, the gate electrode 72 is provided via the gate insulation layer 71. For the F type FET (Pch), the N layer 53 as the back gate is floating, and it is not connected to the terminal. Therefore, high speed action is possible.

As shown in FIG. 11B, for the F type FET (Nch), the Nch MOS transistor is formed on the SOI substrate 54 constituted from the first substrate 51, the box layer (the buried in oxide film) 52, and the second substrate (not shown in the diagram). In the second substrate (not shown in the diagram), the P layer 57, the shallow trench isolation (STI) 55, and the N$^+$ layer 58 are provided. The P layer 57 and the N$^+$ layer 58 are separated with the shallow trench isolation (STI) 55 in the surrounding. The P layer 57 as the back gate is provided with the N$^+$ layer 58 as the source and the N$^+$ layer 58 as the drain on both sides thereof. On top of the P layer 57, the gate electrode 72 is provided via the gate insulation layer 71. For the F type FET (Nch), the P layer 57 as the back gate is floating, and it is not connected to the terminal. Therefore, high speed action is possible.

As shown in FIG. 12A, for the S type FET (Pch), the Pch MOS transistor is formed on the SOI substrate 54 constituted from the first substrate 51, the box layer (the buried in oxide film) 52, and the second substrate (not shown in the diagram). The explanation for the portions that are the same as those in the F type FET (Pch) shown in FIG. 11A will be omitted, and only the different portions will be explained.

The N$^+$ layer 58 is provided in the source section, and the P$^+$ layer 61 is provided on the surface portion in contact with the N layer 53 of the N$^+$ layer 58. The N$^+$ layer 58 and the P$^+$ layer 61 are connected to the source. Therefore, for the S type FET (Pch), the N layer 53 as the back gate is connected to the source via the N$^+$ layer 58 and the P$^+$ layer 61. For the S type FET (Pch), the speed is lower in comparison to the F type FET (Pch), but the drain pressure resistance can be increased and the ESD resistant amount can be improved.

As shown in FIG. 12B, for the S type FET (Nch), the Nch MOS transistor is formed on the SOI substrate 54 constituted from the first substrate 51, the box layer (the buried in oxide film) 52, and the second substrate (not shown in the diagram). The explanation for the portions that are the same as those in the F type FET (Pch) shown in FIG. 11B will be omitted, and only the different portions will be explained.

The P$^+$ layer 56 is provided in the source section, and the N$^+$ layer 62 is provided on the surface portion in contact with the P layer 57 of the P$^+$ layer 56. The P$^+$ layer 56 and the N$^+$ layer 62 are connected to the source. Therefore, for the S type FET (Nch), the P layer 57 as the back gate is connected to the source via the P$^+$ layer 56 and the N$^+$ layer 62. For the S type FET (Nch), the speed is lower in comparison to the F type FET (Nch), but the drain pressure resistance can be increased and the ESD resistant amount can be improved.

For the output buffer 41, since the S type FET is used, the ESD resistant amount can be improved. As a result, the ESD resistant amount with respect to the terminal Pdata can be improved. For the input buffer 31 and the input buffer 32, since the F type FET is used, the propagation delay of signals can be suppressed.

For the serial-parallel conversion circuit 5, the S type FET is used in the Pch MOS transistor on the side on which the parallel data signal Dia is output. Other than this, in the Pch MOS transistor and the Nch MOS transistor constituting the serial-parallel conversion circuit 5, it is preferable to use the F type FET.

The reason is that when the high-potential power source Vdd1 is changed from the supply to the shutoff (not supplied) state, in the case in which all transistors constituting the serial-parallel conversion circuit 5 are the F type FET, the output side will be in the Hi–Z (high impedance) state. As a result, a hazard of maintaining the potential before the shutoff (no supply) of the high-potential power source Vdd1 will occur.

In the case in which the S type FET is used in the Pch MOS transistor on the side for outputting of the parallel data signal Dia, the P layer 57 as the back gate connected to the source via the N$^+$ layer 58 and the P$^+$ layer 61 and the P$^+$ layer 56 connected to the drain on the output side are subjected to the diode connection (refer to FIG. 12A). As a result, the electric charge on the output side is discharged and the output side is cancelled from the Hi–Z (high impedance) state. The parallel data signal Dia on the output side is set at the low level.

By simply having the S type FET for only the Pch MOS transistor provided on the side for outputting of the parallel data signal Dia or the like, the decrease in the high speed of the serial-parallel conversion circuit 5 can be suppressed to a large extent.

As described above, in the high-frequency semiconductor switch and the terminal device, the input buffer 31 is provided between the serial-parallel conversion circuit 5 and the terminal Pclk. Between the serial-parallel conversion circuit 5 and the terminal Pdata, the input buffer 32 and the output buffer 41 are provided. In the input buffer 31 and the input buffer 32, the F type FET is used accordingly. In the output buffer 41, the S type FET is used accordingly. For the serial-parallel conversion circuit 5, the S type FET is used accordingly in the Pch MOS transistor provided on the side for the outputting of the parallel data signal Dia. Other than this, in the Pch MOS transistor and the Nch MOS transistor, the F type FET is used accordingly.

Therefore, the improvement in the ESD resistant amount with respect to the terminal Pdata and the high speed action of the serial-parallel conversion circuit 5, the input buffer 31 and the input buffer 32 can be made compatible.

In the embodiment, the high-frequency semiconductor switch has been configured with the MOS transistor. However, it is not to be restricted to this. For example, the gate can also be configured with an MIS transistor that employs an insulation film having a high dielectric constant. The circuits constituting the high-frequency semiconductor switch have been formed on the same SOI substrate and integrated on one chip. However, it is not to be restricted to this. They can also be formed on separate SOI substrates.

Furthermore, in Embodiment 2, the serial-parallel conversion circuit 5 has been made of the SOI type MOS transistors with the complete depletion structure. However, it is not to be restricted to this. It can also be made of the SOI type MOS transistors with the partial depletion structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high-frequency semiconductor switch, comprising:
a serial-parallel conversion circuit configured to generate a parallel data signal from a serial data signal;
a power supply circuit configured to generate a first positive voltage, a second positive voltage, and a negative voltage; and
a drive circuit connected to the power supply circuit to be supplied with the first positive voltage, the second positive voltage, and the negative voltage, the drive circuit including an inverter and a differential type of level shifter, wherein the inverter is configured to generate an inverted parallel data signal from the parallel data signal, and the differential type of level shifter is configured to generate a high level signal having a voltage level of the second positive voltage and a low level signal having a voltage level of the negative voltage based on the parallel data signal and the inverted parallel data signal.

2. The high-frequency semiconductor switch according to claim 1, wherein
the differential type of level shifter comprises a first level shifter to which the second positive voltage is supplied, and the parallel data signal and the output signal of the inverter are input, and from which the high level signal is output, and a second level shifter to which the second positive voltage and the negative voltage are supplied, and the output signal of the first level shifter is input, and from which the low level signal is output.

3. The high-frequency semiconductor switch according to claim 1, wherein the serial-parallel conversion circuit and the power supply circuit each have a power source.

4. The high-frequency semiconductor switch according to claim 3, wherein
voltage levels of the high-potential power source supplied to the serial-parallel conversion circuit and the first positive voltage are the same.

5. The high-frequency semiconductor switch according to claim 3, wherein
when the power source of the serial-parallel conversion circuit is disconnected from the serial-parallel conversion circuit and the power source of the drive circuit is connected to the power supply circuit, the drive circuit is configured to output the high level signal and the low level signal.

6. The high-frequency semiconductor switch according to claim 1, wherein the first level shifter includes a source follower circuit.

7. The high-frequency semiconductor switch according to claim 1, wherein
the serial-parallel conversion circuit, the power supply circuit, and the drive circuit are integrated on a single SOI substrate.

8. A high-frequency semiconductor switch, comprising:
a serial-parallel conversion circuit to which a clock signal is input via a first input buffer and a serial data signal synchronized to the clock signal is input via a second input buffer, the serial-parallel conversion circuit forming a parallel data signal and, during an output mode, outputting a data signal via an output buffer; and
a drive circuit provided with a level shifter circuit to which the parallel data signal is input, the drive circuit outputting a high level signal having a positive voltage level and a low level signal having negative voltage level,
wherein the output buffer includes a MOS transistor having a back gate connected to the source, and the first and second input buffers each include a MOS transistor with a floating back gate.

9. The high-frequency semiconductor switch according to claim 8, wherein
the first input buffer, the second input buffer, the output buffer, and the serial-parallel conversion circuit are integrated on a single substrate that includes SOI type Nch MOS transistors and Pch MOS transistors.

10. The high-frequency semiconductor switch according to claim 9, wherein
the serial-parallel conversion circuit includes a Pch MOS transistor for outputting the parallel data signal from a drain side thereof, a back gate of the Pch MOS transistor being connected to a source of the Pch MOS transistor.

11. The high-frequency semiconductor switch according to claim 10, wherein the serial-parallel conversion circuit includes additional MOS transistors each having a back gate that is floating.

12. The high-frequency semiconductor switch according to claim 8, wherein the serial-parallel conversion circuit has a power source, and the drive circuit is configured to output the high level signal and the low level signal even when the power source of the serial-parallel conversion circuit is disconnected from the serial-parallel conversion circuit.

13. The high-frequency semiconductor switch according to claim 8, wherein
the serial-parallel conversion circuit, the power supply circuit, and the drive circuit are integrated on a single SOI substrate.

14. A terminal device, comprising:
a high-frequency semiconductor switch including a serial-parallel conversion circuit, a power supply circuit, a drive circuit, and a switch circuit, wherein
the serial-parallel conversion circuit generates a parallel data signal from a serial data signal input thereto;
the power supply circuit generates a first positive voltage, a second positive voltage, and a negative voltage;
the drive circuit is supplied with the first positive voltage, the second positive voltage, and the negative voltage, includes an inverter to which the parallel data signal is input, and a differential type of level shifter to which the parallel data signal and the output signal of the inverter are input, and outputs high level signals having a voltage level of the second positive voltage and low level signals having a voltage level of the negative voltage; and
the switch circuit performs switching based on the high level signals and the low level signals output from the drive circuit.

15. The terminal device according to claim 14, wherein
the differential type of level shifter comprises a first level shifter to which the second positive voltage is supplied, and the parallel data signal and the output signal of the inverter are input, and from which the high level signal is output, and a second level shifter to which the second positive voltage and the negative voltage are supplied, and the output signal of the first level shifter is input, and from which the low level signal is output.

16. The terminal device according to claim 14, wherein the serial-parallel conversion circuit has a high-potential power source supplied thereto.

17. The terminal device according to claim 16, wherein
voltage levels of the high-potential power source supplied to the serial-parallel conversion circuit and the first positive voltage are the same.

18. The terminal device according to claim 14, wherein
when a power source for the serial-parallel conversion circuit is disconnected from the serial-parallel conversion circuit a power source for the power supply circuit remains connected to the power supply circuit, the drive circuit outputs the high level signals and the low level signals.

19. The terminal device according to claim 14, wherein the first level shifter includes a source follower circuit.

20. The terminal device according to claim 14, wherein
the serial-parallel conversion circuit, the power supply circuit, the drive circuit, and the switch circuit of the high-frequency semiconductor switch are provided on a single SOI substrate, and configured with SOI type MOS transistors.

* * * * *